(12) United States Patent
Jackson et al.

(10) Patent No.: US 6,621,098 B1
(45) Date of Patent: Sep. 16, 2003

(54) THIN-FILM TRANSISTOR AND METHODS OF MANUFACTURING AND INCORPORATING A SEMICONDUCTING ORGANIC MATERIAL

(75) Inventors: Thomas Jackson, State College, PA (US); Jianna Wang, Waltham, MA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/449,559

(22) Filed: Nov. 29, 1999

(51) Int. Cl.$^7$ .................. H01L 35/24; H01L 51/00; H01L 29/76; H01L 31/036; H01L 31/112
(52) U.S. Cl. .................. 257/40; 257/66; 438/99
(58) Field of Search .................. 257/40, 66; 438/99

(56) References Cited

U.S. PATENT DOCUMENTS

| | | | |
|---|---|---|---|
| 5,347,144 A | * 9/1994 | Garnier et al. | 257/40 |
| 5,500,537 A | * 3/1996 | Tsumura et al. | 257/40 |
| 5,700,696 A | * 12/1997 | Chandross et al. | 438/800 |
| 6,204,515 B1 | * 3/2001 | Bernius et al. | 257/40 |
| 6,331,356 B1 | * 12/2001 | Angelopoulos et al. | 428/411.1 |
| 6,473,072 B1 | * 10/2002 | Comiskey et al. | 345/173 |

| | | | |
|---|---|---|---|
| 2002/0021087 A1 | * 2/2002 | Eida et al. | 313/504 |

OTHER PUBLICATIONS

Pomerantz et al., Synth. Met. (1991), 41(3), 825–30 (Abstract).
JP 04151157, Hyodo et al., Oct. 15, 1990 (Abstract).
Pei et al., Synth. Met. (1993), 55(2–3), 1221–6 (Abstract).
Huang et al, Proc.—Electrochem. Soc. (1987), 87–12 (Proc. Symp. Electrode Mater. Processes Energy Convers. Storage, 2nd, 1987), 100–7 (Abstract).

* cited by examiner

Primary Examiner—Carl Whitehead, Jr.
Assistant Examiner—William Vesperman
(74) Attorney, Agent, or Firm—Birch, Stewart, Kolasch & Birch, LLP.

(57) ABSTRACT

The present invention is drawn to a thin-film transistor having a layer of semiconducting organic material provided on an insulating substrate and integrated with at least two electrical contacts for applying an electric voltage to the semiconducting organic material, wherein the semiconducting organic material is a semiconducting organic random copolymer with a highly ordered chain structure, a large effective conjugation length and a high regioregularity, and wherein the copolymer is synthesized from different fractions of at least two organic monomer compounds, with the smallest of the at least two monomer compounds being present in the lowest fraction.

11 Claims, 9 Drawing Sheets

3-METHYL THIOPHENE

FIG.2a

3-HEXYL THIOPHENE

FIG.2b

STRUCTURE OF COPOLYMER

FIG.2c

REGIOREGULAR

FIG.2d

REGIORANDOM

THIN-FILM TRANSISTOR AND METHODS OF MANUFACTURING AND INCORPORATING A SEMICONDUCTING ORGANIC MATERIAL

The present invention concerns a thin-film transistor comprising a layer of semiconducting organic material provided on an insulating substrate and integrated with at least two electrical contacts for applying an electric current to said semiconducting organic material; a method for improving the chain order and increasing the conjugation length of a semiconducting organic polymer for use as a semiconducting material in a thin-film transistor; and a method for copolymerization of thiophenes, particularly thiophene and/or monomer thiophene compounds, in the manufacture of copolymer thiophene compounds with improved chain order and increased conjugation length for use in organic thin-film transistors. The invention also concerns the use of a semiconducting copolymer in an organic thin-film transistor as well as the use of a copolymer of thiophene compounds in an organic thin-film transistor.

Thin-film transistors have lately been the subject of increasing attention with regard to the fabrication of low-cost and flexible displays and other uses within the electronics where it is desired to manufacture components and devices covering large areas. Inexpensive semiconducting polymer materials which are soluble, easy to process and environmentally stable offer important advantages in such applications. Homopolymers of 3-alkyl thiophenes with alkyl groups equal to or greater than butyl in size are easily soluble at room temperature in common solvents such as chloroform, toluene, xylene, tetrahydrofuran etc. However, the incorporation of a large alkyl side group also will increase the distance between the $\pi$-conjugated backbones and hence reduce the effective conjugation length. For organic thin-film transistors a large effective conjugation length in the active organic semiconductor is directly related to high carrier mobility. The carrier mobility of solvent cast poly(3-alkyl thiophene) typically lies in the range $10^{-8}$–$10^3$ $cm^2/V \cdot s$, such as evident from F. Garnier, "Thin-Film Transistors Based On Organic Conjugated Semiconductors", Chemical Physics, 227:253–262 (1998).

Regioregular poly(3-hexyl thiophenes) P3HT) which are characterized as polymers with regiospecificity from head-to-tail, have a significantly extended conjugation length and highly ordered structures such as evident from T-A. Chen, X. Wu and R. D. Rieke, "Regiocontrolled Synthesis of Poly(3-alkyl thiophenes)", mediated by Riek Zinc, "Their Characterization and Solid-State Properties", J.Am. Chem. Soc., 117: 233–244 (1995).

Higher mobility, viz. 0.01–0.4 $cm^2/V \cdot s$, has been described by Zenan Bao, Yi Feng, Ananth Dodabalapur, V.R. Raju and Andrew J. Lovinger, Chemistry of Materials, vol. 9: 1299–1301 (1997) for regioregular poly(3-hexyl thiophene). However, the complicated regiosynthesis and purification procedures significantly increase the material cost. It has therefore been necessary to develop other types of poly(3-alkyl thiophenes) which have a moderate synthesis procedure and which offer high carrier mobility for organic thin-film transistors. A method for synthesizing poly(3-alkyl thiophenes) is described in R-I. Sugimoto, S. Takeda, H. B. Gu and K. Yoshino, "Preparation of Soluble Polythiophene Derivates Utilizing Transition Metal Halides as Catalysts and Their Property", Chemistry Express, Vol. 1, No. 11:635–638 (1986).

A first object of the present invention is hence to provide a thin-film transistor with an organic semiconducting material offering a higher carrier mobility. Another object of the present invention is to develop new types of polymers for the semiconducting material. Particularly it is an object of the invention to provide polymers of this kind which can be processed in solution and which have a higher order of chain structure, but simultaneously lower cost. It is also an object of the invention to increase the conjugation length of such polymers. Finally it is an object of the present invention to provide semiconducting polymer materials for use in organic thin-film transistors.

The above-mentioned objects and other features and advantages are obtained according to the present invention with thin-film transistor which is characterized in that said semiconducting organic material is a semiconducting organic copolymer with a highly ordered chain structure and increased conjugation length and formed from at least two organic monomer compounds; and with a method characterized by forming a copolymer from at least two organic monomer compounds.

In a first advantageous embodiment according to the invention the semiconducting organic copolymer is a copolymer of thiophenes, particularly thiophene and/or alkyl-substituted monomer thiophene compounds.

In this connection it preferred that the copolymer is either a copolymer of thiophene and one or more alkyl-substituted thiophene monomers, or a copolymer of thiophene and one of the following thiophene compounds: 3-hexylthiophene, 3-butylthiophene, or dodecylthiophene, or a copolymer of 3-methylthiophene and one of the following thiophene compounds: 3-hexylthiophene, 3-butylthiophene, or dodecylthiophene.

In a second advantageous embodiment of the transistor according to the invention the copolymer is a copolyiner of one or more of the following monomer compounds: substituted and/or unsubstituted phenylenes, xylylenes, xylylidenes, phenylene sulfides, or classes of these monomer compounds.

In a third advantageous embodiment of the transistor according to the invention the copolymer is a copolymer of general semiconducting and/or conducting organic polymers synthesized from monomer compounds. Particularly it is in this connection preferred that the organic polymers are synthesized from one of the following compounds: N-vinylcarbazole, epoxyproprycarbazole, pyromellitimide, N-phenylbenzimidazole, benzoxazole, acylonitrile, azine, phtalocyanine, vinylene, azophenylene, phenylenequinone, or phenyleneferrocene.

In a first advantageous embodiment of the method according to the invention the copolymer is formed with different fractions of said at least two monomer compounds, the fraction of a smaller monomer compound being lower than that of a larger monomer compound.

In a second advantageous embodiment the method according to the invention the monomer compounds are selected among asymmetrical monomer compounds.

In a third advantageous embodiment of the method according to the invention, monomer units or molecule sections of monomers having a minimal or reduced steric hindrance are incorporated in the copolymer.

Other advantageous embodiments of the above method according to the invention are apparent from the appended dependent claims 13–19 which disclose various preferred compounds used for forming the copolymer, these compounds being similar to those disclosed for the copolymer as used in the various advantageous embodiments of the transistor according to the invention as stated hereinbefore.

Particularly the above mentioned objects and other feature and advantages are obtained according to the present invention with a further method which is characterized by comprising steps for mixing thiophene or a first monomer thiophene compound with a second monomer thiophene compound, such that said compounds form a monomer mixture with a molar feed ratio of the components thiophene or said first monomer thiophene compound and said second monomer thiophene compounds between 0:10 and 4:6, forming a reaction mixture of said monomer mixture by adding the latter to a stirred solution of an oxidant, the solution being formed with a solvent purged with an inert gas, such that a reaction mixture is obtained, stirring said reaction mixture during a first time period at a given temperature, adding said reaction mixture to precipitation agent such that a precipitate is formed, rinsing said precipitate with a rinsing agent, such that a solid substance is obtained and subjecting said solid substance to extraction with a first extraction agent during a second given time period and thereafter with a second extraction agent during a given third time period, whereby a purified reaction product in the form of poly(3-alkyl thiophene) was formed and thereafter dried under vacuum.

Various advantageous embodiments of the further method according to the invention are apparent from the appended dependent claims 21–34.

Finally the above-mentioned and other features and advantages are obtained according to the invention with the use of a semiconducting organic copolymer with a highly ordered chain structure and increased conjugation length and formed from at least two organic monomer compounds in an organic thin-film transistor, and particularly with the use of a copolymer of 3-methyl thiophene and 3-hexyl thiophene as an active semiconducting material in an organic thin-film transistor.

The invention shall now be discussed in more detail with reference to the preferred embodiments of the transistor and the methods according to the invention as well as the accompanying drawing, wherein.

FIGS. 1a–d show schematically the structure of a thin-film transistor as known in the art, but applicable to the implementation of the thin-film transistor according to the invention. Generally FIGS. 1a–d can be thought of as showing a thin-film MOSFET transistor with a gate electrode and source and drain electrodes contacting the semiconducting layer which according to the invention is an organic copolymer material.

Figure 1A:
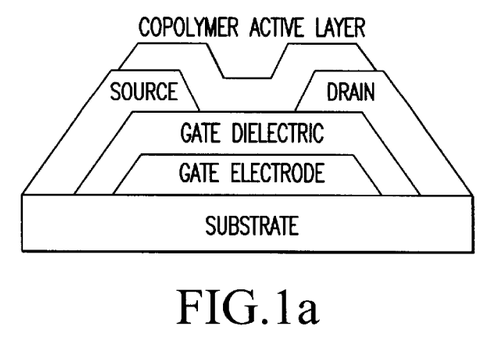
FIGS. 1a–1d show embodiments of a thin-film transistor as known to persons skilled in the art, but embodying the teachings of the present invention.

FIG. 1a shows a first embodiment of the thin-film transistor according to the invention. This embodiment is favourable in case the semiconducting copolymer is very sensitive to exposure to organic solvents. It is well-known that small molecule organic semiconducctors, as e.g. pentacene or α-hexathienyl is very sensitive to exposure to organic such solvents. The advantage with the embodiment in FIG. 1 is that the source and drain contacts can be patterned prior to the deposition of the copolymer layer and any processing of the transistor after the deposition of the copolymer layer is minimized. However, some of the copolymers used in the present invention, including copolymers of thiophene and/or alkyl-substituted thiophenes, are quite stable when exposed to a range of organic solvents and other processing chemicals, provided of course that the film is not simply dissolved. This allows more flexibility in the design of the transistor according to the invention.

Figure 1B:
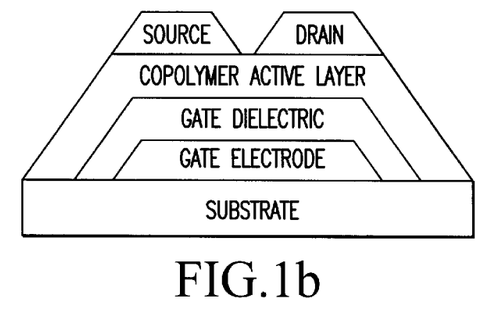
Figure 1C:
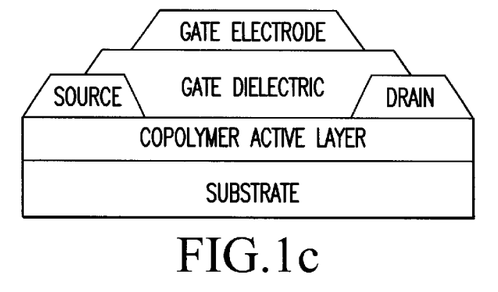

FIG. 1a has a gate electrode on the substrate with source and drain contact provided under a copolymer active layer. As noted above, this embodiment is similar to device structures which are likely to be used with small molecular organic semiconductors. FIG. 1b also shows the gate electrode at the bottom of the device, but with source and drain contacts patterned on the top of the copolymer active layer. This is quite similar to the device structure used for hydrogenated amorphous silicon, the so-called staggered inverted structure (staggered because the source and drain contacts are on the opposite side of the semiconductor layer in relation to the gate electrode, and inverted because the gate electrode is at the bottom of the structure). The embodiment in FIG. 1b is also similar to device structures often used with small-molecule organic semiconductors and shadow-masked contacts, but with solvent-resistant copolymers shadow masking may not necessarily be used and the contacts may equally well be patterned photolitographically. In FIG. 1c the copolymer active layer is deposited on the substrate and the source and drain electrodes, the gate dielectric and the gate electrode are all deposited and patterned on the top of the active semiconductive layer.

Figure 1D:
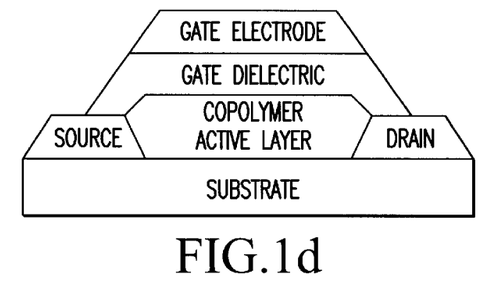

The embodiment shown in FIG. 1d also has the gate dielectric and the gate electrode provided on the top, but the copolymer active layer is deposited and possibly patterned on the top of already patterned source and drain electrodes.

It is evident that the transistor according to the invention may be a hybrid inorganic/organic transistor, where the semiconducting inorganic polymer material should be compatible with inorganic materials in the contacts and the insulating substrate. It is of course, also possible that the transistor according to the invention may be an all-organic transistor, for instance one resembling that disclosed in U.S. Pat. No. 5,347,144 (Garnier & al.) and then wholly realized in organic materials, including organic conducting and insulating materials in addition to the semiconducting organic polymer. In any case the semiconducting organic material of the transistor according to the invention is a semiconducting inorganic polymer with a highly ordered chain structure and increased conjugation length formed from at least two organic monomer compounds. Higher chain order and increased conjugation length will contribute to an improvement in the carrier mobility of transistors of this kind.

According to the present invention the chain order and increased conjugation length is obtained by forming a copolymer from at least two organic monomer compounds.

Generally there shall in this regard be remarked that increased conjugation length can be obtained in two different ways. In a first general approach copolymerization is used to improve the order of individual copolymer molecules. This is seen for 3-methyl thiophene and 3-hexyl thiophene copolymers as an increase in regioregularity, measured for instance by MNR, and an optical redshift which indicates increased conjugation length. This may however, happen in more than one way. When for instance using thiophene and/or alkyl-substituted thiophene copolymers, it is preferred to use a monomer feed ratio which results in the copolymer with a substantial fraction of the smaller monomer component. The copolymer is expected to form nearly randomly with perhaps a small driving force for short chain segments of similar monomer units. By using a substantial molar fraction short chain segments are formed with repeating similar monomer units and small steric interference effects additionally contributes to forming a copolymer with improved regioregularity. In a preferred embodiment of the present invention which is to be discussed in greater detail below, copolymers of 3-methyl thiophene or thiophene itself with thiophenes with longer alkyl substitutions are used. Alkyl-substituted thiophenes are only soluble in typical organic solvents when the alkyl substituent has at least four carbon atoms, i.e. butyl or longer. This implies that polymers of thiophene or 3-methyl thiophene are not soluble. Hence an upper limit is set on the amount of the smaller monomer component that usefully can be incorporated in the polymer by the point where the resulting copolymer is no longer soluble. This will be about 40% 3-methyl thiophene in a 3-methyl thiophene/3-hexyl thiophene copolymer which is obtained from using a feed of about 35% of the 3-methyl thiophene monomer in the synthesis; or about 25% thiophene in a thiophene/3-hexyl thiophene copolymer. It is also expected that copolymers of other materials synthesized in a similar manner shall show improved ordering, at least for small monomer units.

According to the invention other copolymerization effects may be used to improve the order of individual copolymer molecules. For instance can asymmetric monomer building blocks be used, i.e. monomer building blocks with asymmetric reacitvity or functionalization at the usually two ends of the monomer. In this case the copolymer can only assemble in an order determined by their reacitvity of functionalization. It is further advantageous to also choose monomer components where the $\pi$ orbital overlap is strong with a specified deterministic bonding in order to obtain an improved conjugation length.

In a second general approach the conjugation length is increased by increasing the effective conjugation length of groups of individual copolymer molecules. Particularly it is in this regard desired to increase the $\pi$ orbital overlap of adjacent copolymer molecules. According to a preferred embodiment of the method for improving the semiconducting organic material this is effected by incorporating monomer units that offer minimal or at least steric hindrance for the approach of sections of other molecules or even possibly sections of the same molecules. In the case of alkyl-substituted thiophenes it is the steric hindrance provided by substituents with four or more carbon atoms that opens the polymer structure sufficiently to allow organic solvents to penetrate and make the polymer soluble. But the same steric hindrance and the resulting relatively open structure which is needed for solubility, makes it more difficult for carriers to jump from one molecule to the next. By incorporating molecule sections built from monomers with minimal steric effects it is possible for the conjugated backbones of the adjacent molecules to approach more closely. This will improve carrier movement between molecules and the effective conjugation length is increased. Generally this is maximized for maximum incorporation of the monomer with minimal steric hindrance, but of course, at some point the copolymer may no longer be soluble, which as mentioned above, happens for thiophene or 3-thiophene copolymers with 3-hexyl thiophene. This must, of course, be taken in regard with performing the method according to the invention for improving the chain order and increasing the conjugation length.

A number of candidate materials for forming a copolymer from at least two organic monomer compounds are known and can be used in the method according to the invention for improving the chain order and increasing the conjugation length of a semiconducting organic polymer. In a preferred embodiment of the method the copolymer can be formed as a copolymer of thiophenes, particularly thiophene and/or alkyl substituted monomer thiophene compounds, as a copolymer of thiophene and one or more alkyl-substituted thiophene monomers, or as a copolymer of thiophene and 3-hexyl thiophene, 3-butyl thiophene, or dodecyl thiophene respectively, or as a copolymer of 3-nietyl thiophene and 3-hexyl thiophene, 3-butyl thiophene or dodecyl thiophene respectively.

A particular method according to the invention for copolymerization of thiophenes shall be discussed in more detail below, but it is to be observed that application of copolymers of organic semiconductors in the thin-film transistor according to the invention is nor limited to thiophene and thiophene compounds, as a number of other copolymers are possible. This includes copolymers of substituted and/or unsubstituted phenylenes, xylylenes, xylylidenes phenylene sulfides and similar monomer building blocks and additionally also copolymers between classes of such monomers. Further it is also possible to use copolymer of more general organic semiconducting and/or conducting polymers which are synthesized from monomer components such as N-vinylcarbazole, epoxyproprycarbazole, pyromellitimide, N-phenylbenzimidazole, benzoxazole, acrylonitrile, azine. phtalocvanine, vinylene, azophenylene, phenylenequinone, phenyleneferrocene and similar compounds. The list is not intended to be exhaustive, and other candidate materials may come to light, but it should nevertheless be evident that the number of available building blocks for copolymers as used in the present invention indeed is very large.

As mentioned above, a particular method according to the invention for the copolymerization of thiophenes shall now be discussed in somewhat greater detail.

The basis of the present invention is that polythiophenc (PT) or poly(3-alkyl thiophene) (P3AT) with an alkyl group smaller than butyl, for instance poly(3-methyl thiophene) (P3MT), both are infusible and insoluble, but have higher conductivity than soluble poly(3-alkyl thiophenes) upon doping. This implies that large conjugation lengths exist both in P3 or P3MT. If both 3-methyl thiophene and 3-hexyl thiophene are incorporated in one polymer chain, i.e. form a copolymer, this copolymer may comport some complimentary effects. It may have longer conjugation length while retaining good solubility compared to the P3HT homopolymer. In an embodiment of the copolymerization method according to the invention copolymers of 3-methyl thiophenes and 3-hexyl thiophenes hence were made, as is discussed in more detail in the following. It shall, however, be understood that the method for copolymerization according to the invention also may be used with other monomer mixtures, e.g. such as the system thiophene/3-hexyl thiophene or 3-methyl thiophene/dodecyl thiophene etc.

Figure 2A:
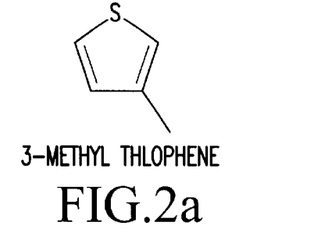
FIG. 2a shows the structure of 3-methyl thiophene monomer, FIG. 2b the structure of 3-hexyl thiophene monomer, FIG. 2c the structure and copolymer formed by one of the monomers in FIGS. 2a and FIG. 2b, FIG. 2d an example of a regioregular structure, FIG. 2e an example of a regiorandom structure, FIG. 3 a number of random copolymer chains formed for instance by monomers of the same kind as in FIGS. 2a and 2b, the random copolymer chains forming crystallites with non-periodic layers, FIG. 4 the $^1$H-NMR spectrum for the copolymer of 3-methyl thiophene and 3-hexyl thiophene with a molar feed ratio 0:10, FIG. 5 the $^1$H-NMR spectrum for the copolymer of 3-methyl thiophene and 3-hexyl thiophene with a molar feed ratio 1:9, FIG. 6 the $^1$H-NMR spectrum for the copolymer of 3-methyl thiophene and 3-hexyl thiophene with a molar feed ratio 2:8, FIG. 7 the $^1$H-NMR spectrum for the copolymer of 3-methyl thiophene and 3-hexyl thiophene with a molar feed ratio 3:7, FIG. 8 the composition and regioregularity of copolymer with 3-methyl thiophene as function of the molar feed ratio, and FIG. 9 the ultraviolet and visible light absorption spectra of copolymers of 3-methyl thiophene and 3-hexyl thiophene.
Figure 2B:
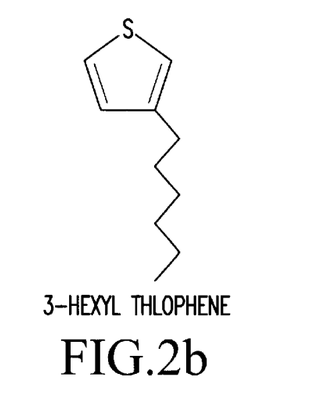
Figure 2C:
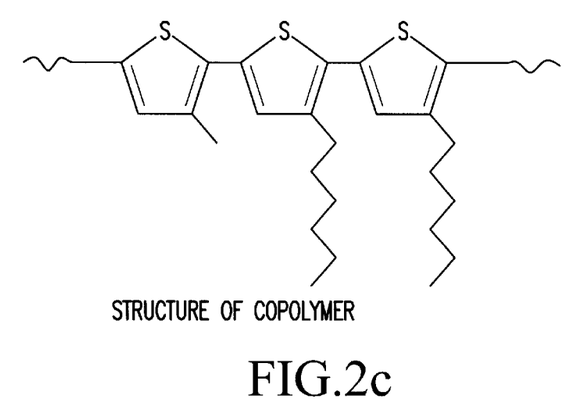
Figure 2D:
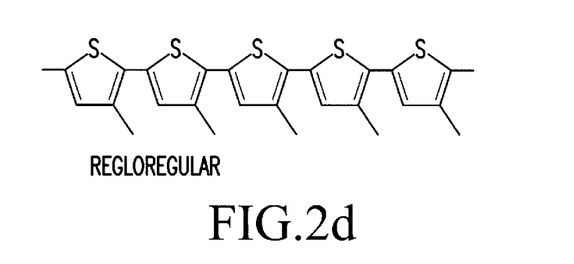
Figure 2E:
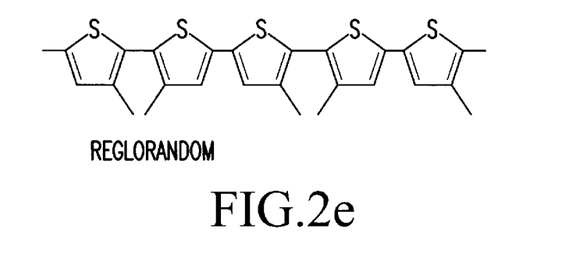

The structures of the monomers 3-methyl thiophene and 3-hexyl thiophene are shown in respectively FIG. 2a and FIG. 2b. The structure of the copolymerized compound thereof is shown in FIG. 2c. With the method according to the invention a copolymer with higher regioregularity is advantageously obtained. This concept is shown in FIG. 2d and implies a high portion of head-to-tail linkages—FIG. 2d shows a proportion of 100% of such linkages. In a regiorandom polymer the percentage of such linkages is low under 50%, such this is shown in FIG. 2e, where the percentage of head-to-tail linkages is 0.

Figure 3:
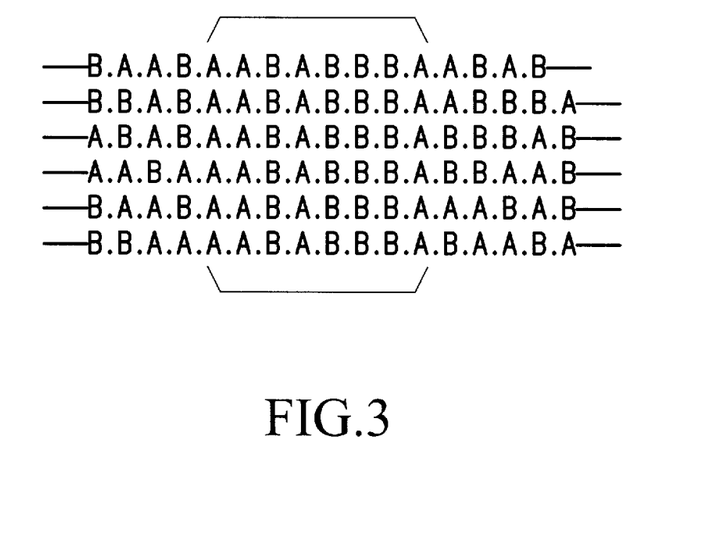
Figure 4:
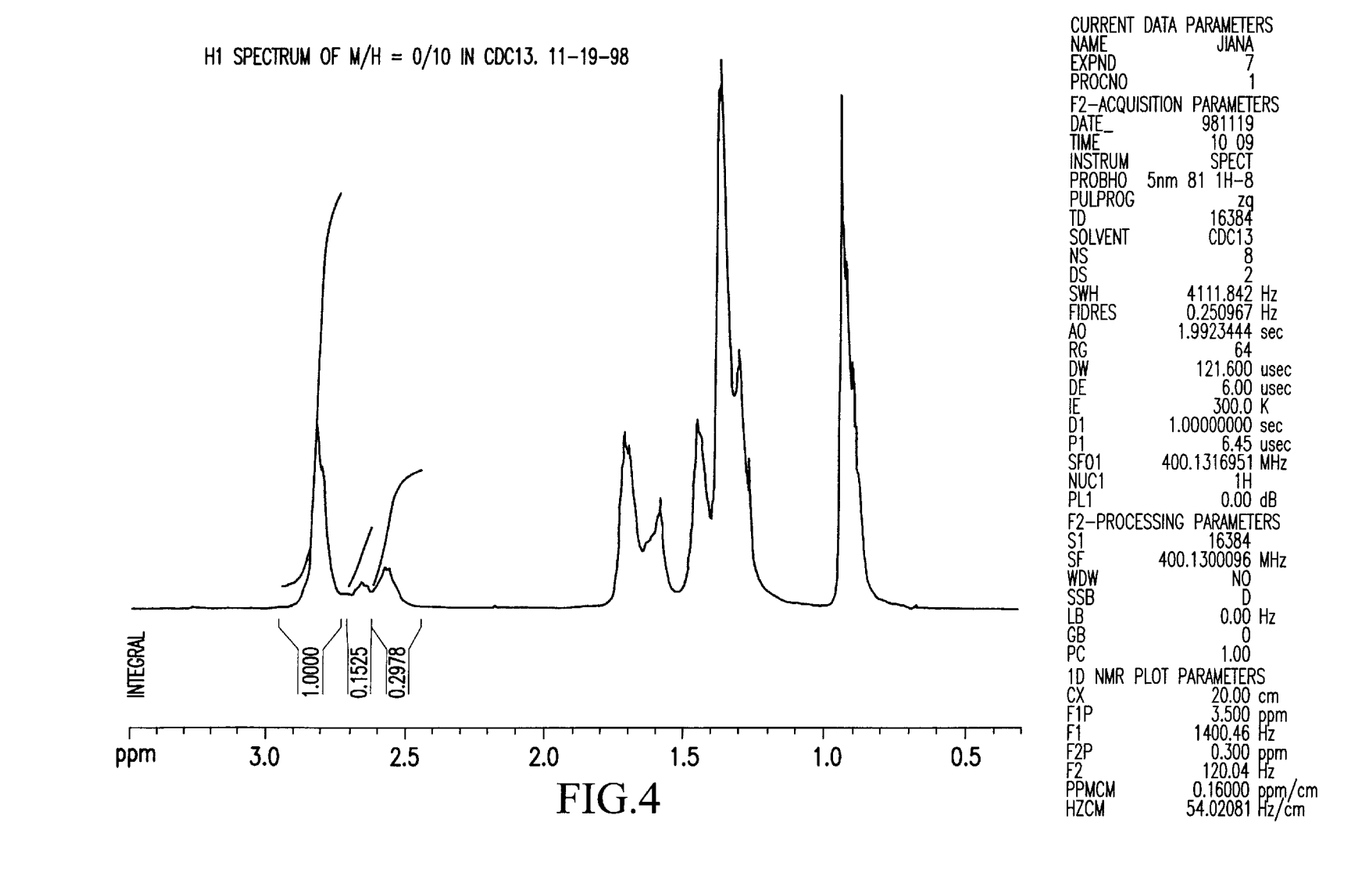
Figure 5:
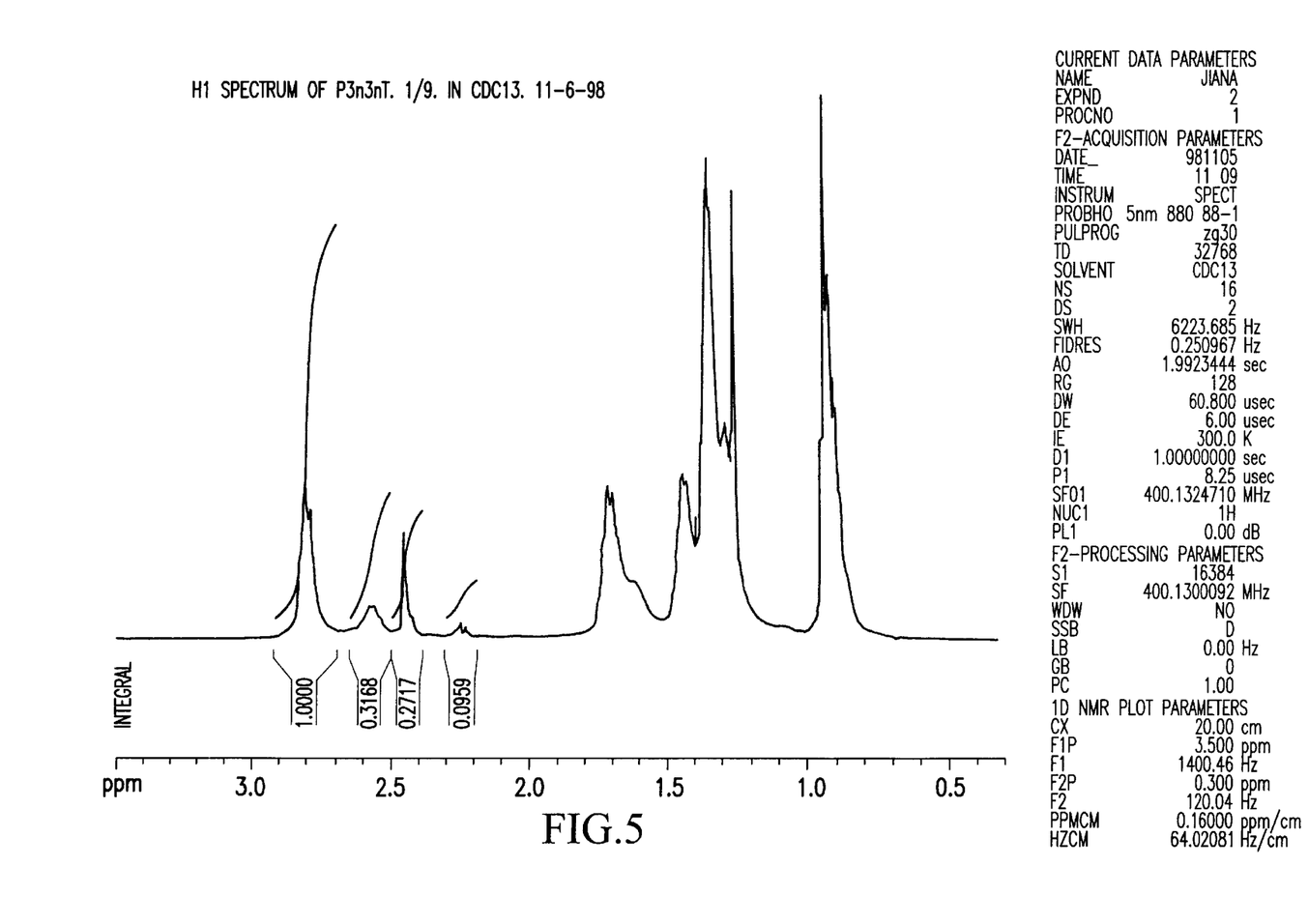
Figure 6:
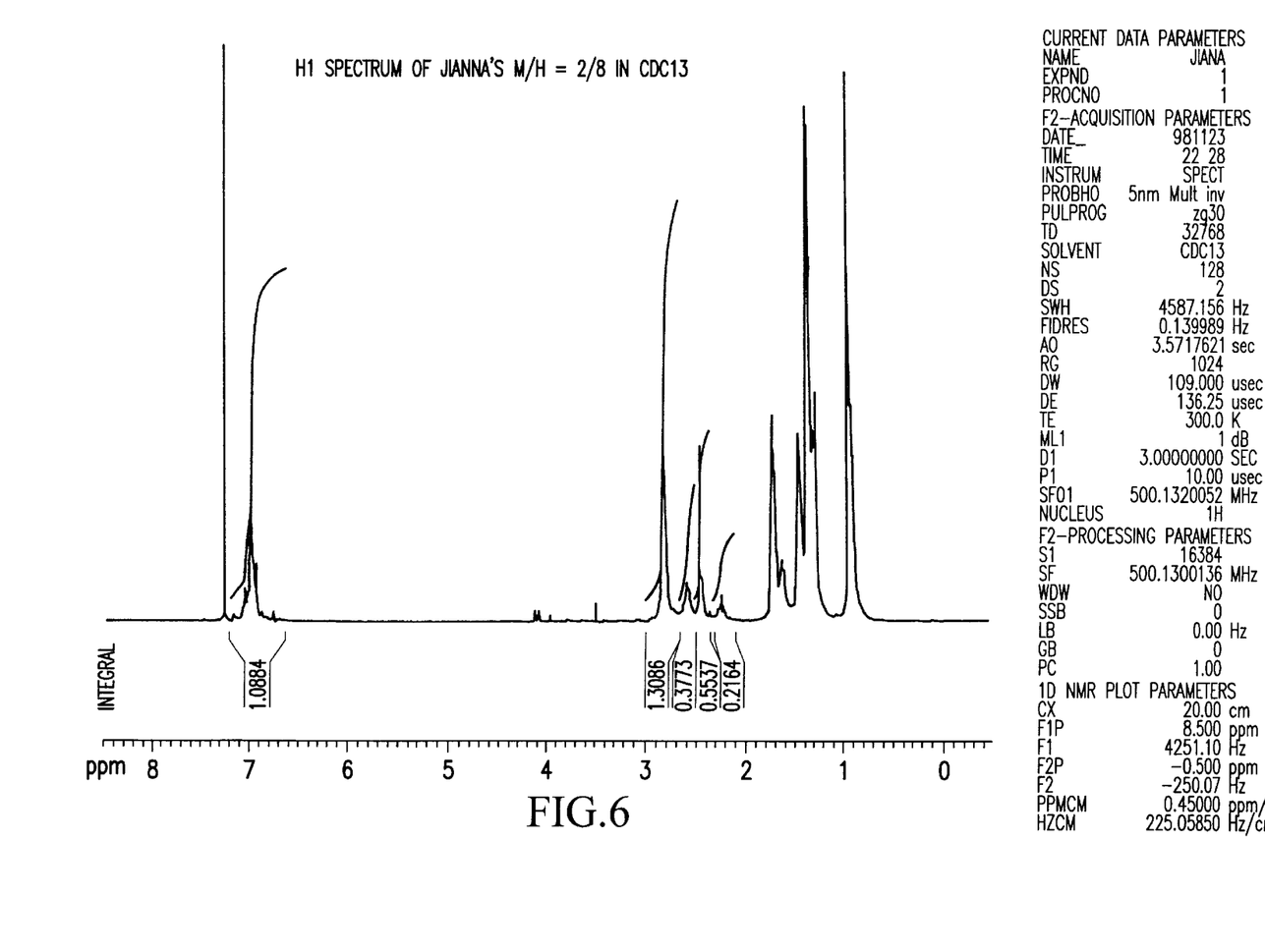
Figure 7:
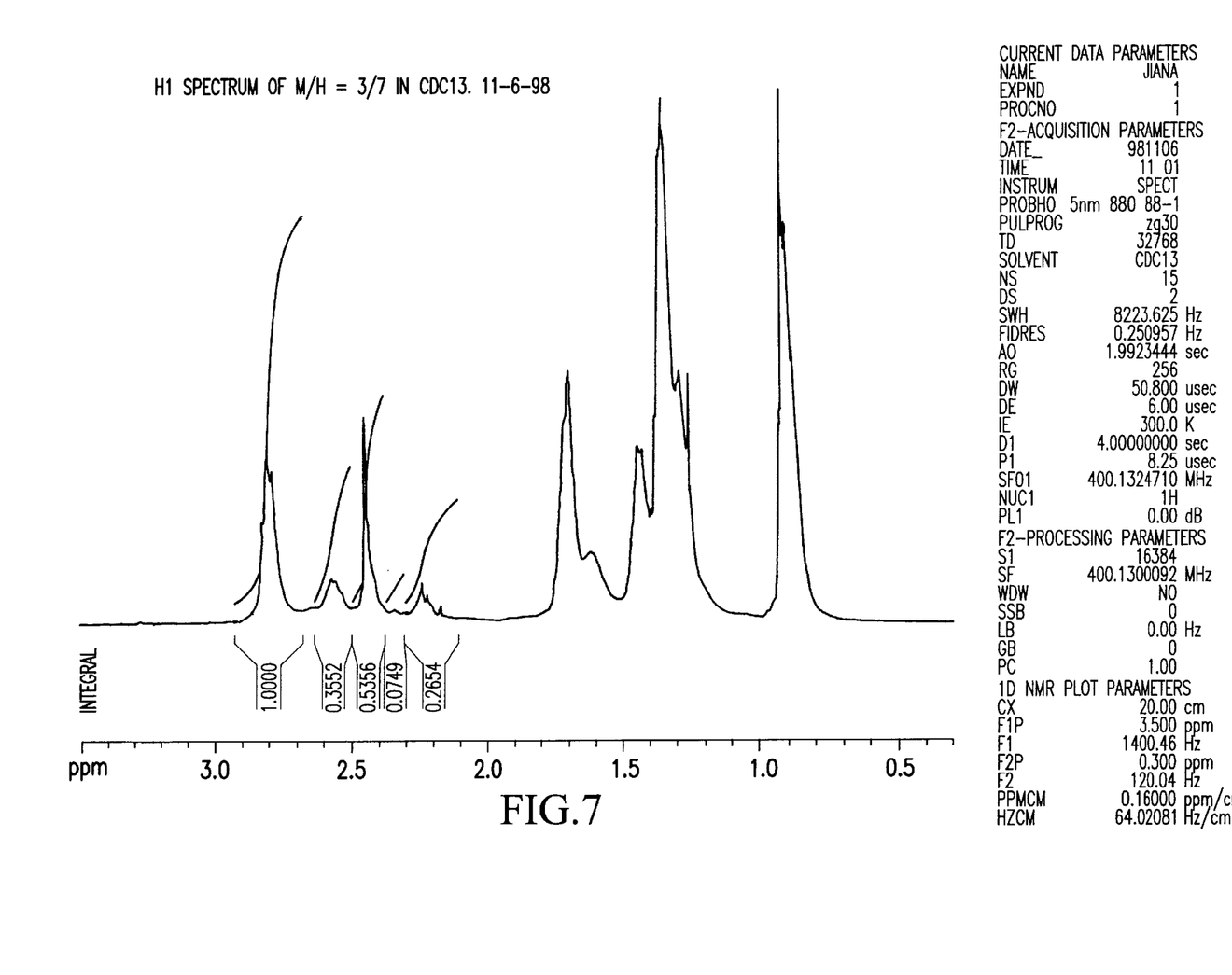

In an advantageous embodiment of the copolymerization method according to the invention a smaller molecule or unit of monomer in the form of a 3-methyl thiophene is inserted in the main chain of poly(3-hexyl thiophene) in order to increase the conjugation length of the polymer. Investigations of the structure order of random copolymers have been presented by S. Hanna and A.H. Windle, "Geometrical Limits to Order in Liquid Crystalline Random Copolymers", Polymer, Vol. 29: 207–223 (1988). Hanna and Windle have formulated the concept of crystallites with non-periodic layers (NPL). According to this model the formation of small crystallites may take place through lateral juxtaposition of parts of the chains which have the same shape as shown in FIG. 3, where the monomers are denoted respectively A and B. In a copolymer of 3-methyl thiophene and 3-hexyl thiophene there is a possibility that the 3-methyl thiophene units form small NPL crystallites.

In a practical embodiment of the copolymerization method according to the invention 3-methyl thiophene and 3-hexyl thiophene were copolymerized with ferrichloride (FeCl$_3$) as oxidant, such this is described in R.-I. Sugimoto & al. (1986). This one-step synthesis multistep regiosynthesis. The molar feed ratio between 3-methyl thiophene and 3-hexyl thiophene was varied from 0:10 to 3:7. In a typical reaction procedure 0.1 mol of the monomer mixture of 3-methyl thiophene and 3-hexyl thiophene was added to a stirred solution of 0.4 mol ferrichloride (FeCl$_3$) in chloroform purged with argon. This reaction mixture was then stirred for 5 hours at 25° C. Then the reaction mixture was added to methanol. A precipitate was formed which was filtered and then washed with methanol and water. After the washing a brown solid was obtained which went through an extraction process in a Soxhlet extractor (i.e. a device with container and condenser for continuous extraction of materials soluble in alcohol or ether) with acetone for three days and then methanol for one day. The purified solid was dried in vacuum and by means of infrared spectroscopy it was confirmed that it was present as poly(3-alkyl thiophene) (PAT). Solubility tests of these copolymers in different solvents were performed. The results show that an increasing content of 3-methyl thiophene reduced the solubility of the copolymer in chloroform, toluene and other solvents which in turn reduced the synthesis yield.

Figure 8:
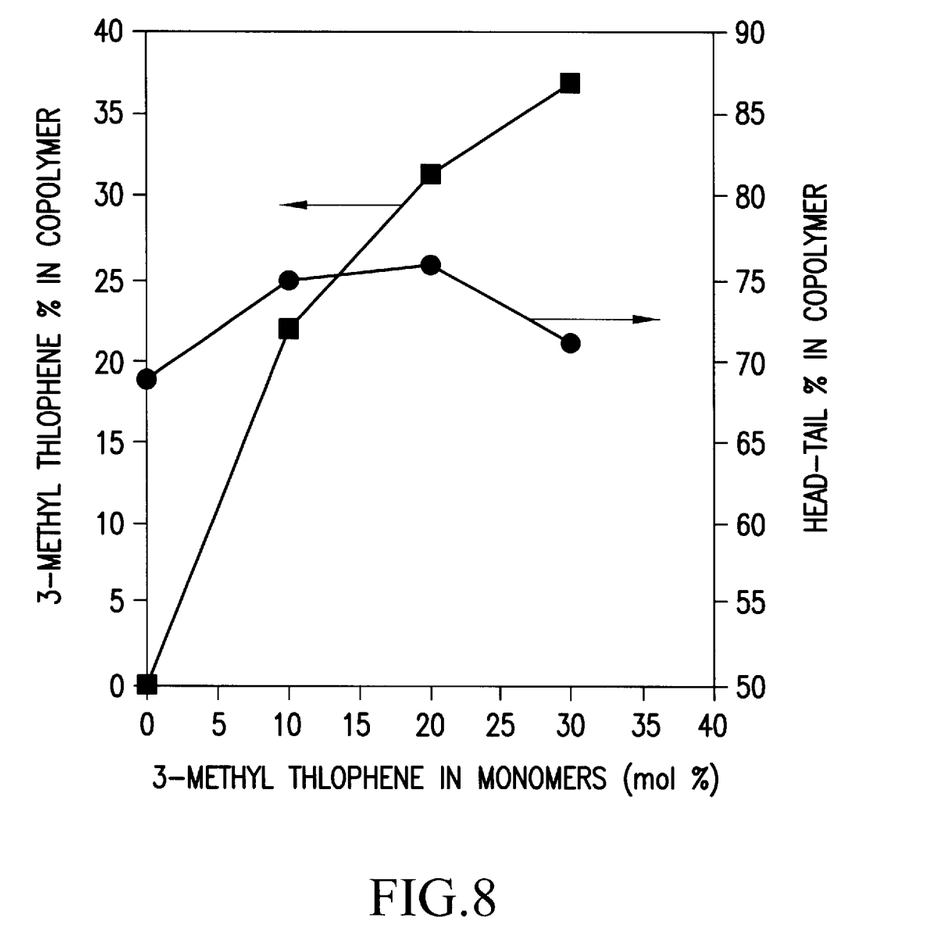

The composition of P3AT was then investigated by means of respectively $^1$H-NMR-spectroscopy at 500 MHz and $^{13}$C-NMR-spectroscopy at 100 MHz. The $^1$H-spectra of copolymers with molar feed ratio between 0:10 and 3:7 are shown in FIGS. 4–7. α-methylene protons of the alkyl group could be resolved for four different diads, namely α-methylene protons on the head-to-tail hexyl group (δ=2.80 ppm), α-methylene protons on the head-to-head hexyl group (δ=2.58 ppm), α-methyl protons on the head-to-tail methyl group (δ=2.45 ppm) and α-methyl protons on the head-to-head methyl group (δ=2,25 ppm). By analyzing the NMR-data the real ratio between 3-methyl thiophene and 3-hexyl thiophene in the copolymer could be determined. In addition the regioregularity, i.e. the percentage of a head-to-tail linkage in the copolymer could also be calculated. FIG. 8 shows the composition of copolymer and regioregularity as function of the molar feed ratio between the monomers. The composition of the copolymer is very different from the composition of the monomer mixture. With for instance 20% 3-methyl thiophene in the monomer mixture about 32% 3-methyl thiophene in the copolymer is obtained. The percentage of head-to-tail linkage in the copolymer is higher than that of pure poly(3-hexyl thiophene), however, it reaches a maximum of 76% when the percentage of 3-methyl thiophene in the monomer mixture is 20%, i.e. a molar feed ratio of 2:8.

Figure 9:
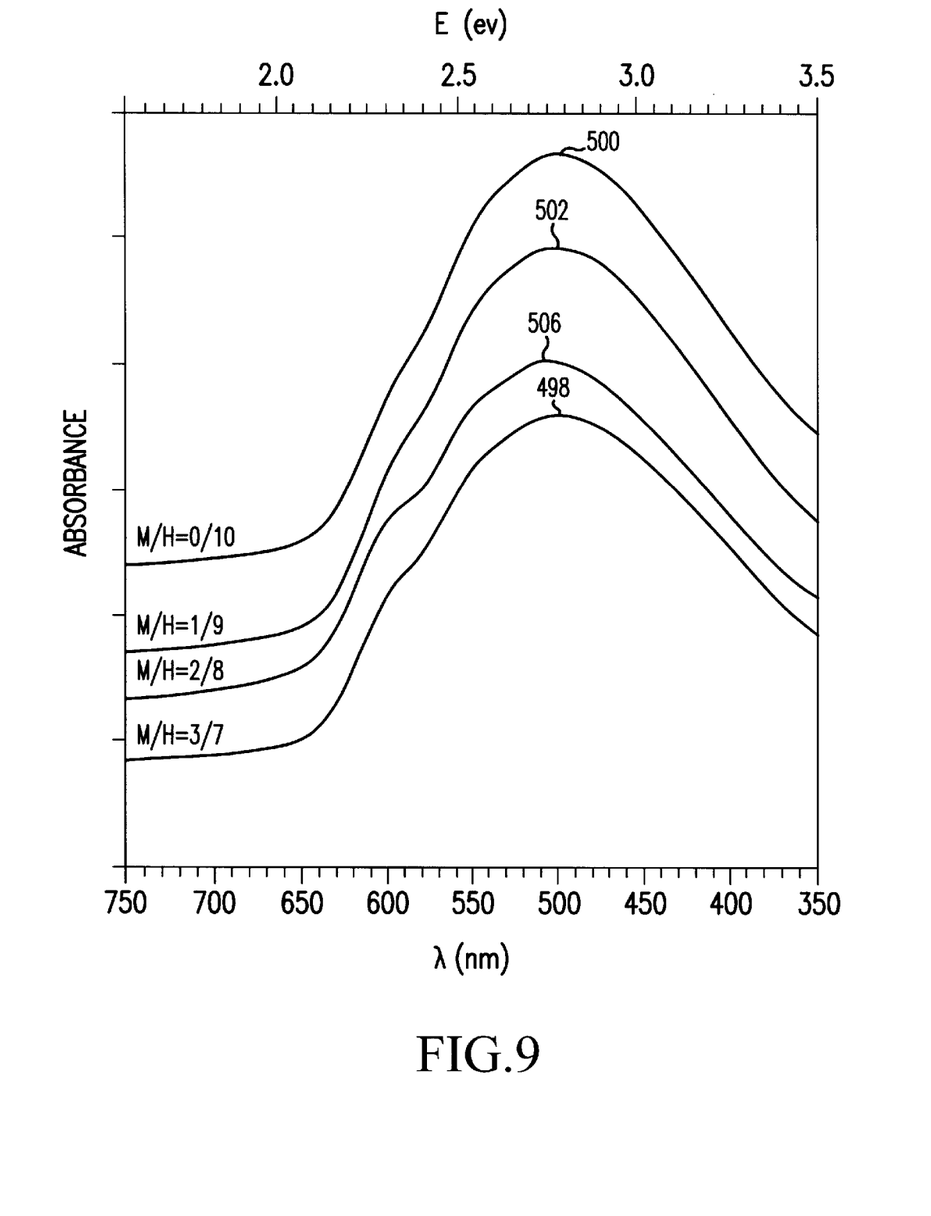

FIG. 9 shows the absorption spectra in ultraviolet and visible light for copolymers with 3-methyl thiophene. When a molar feed ratio of 2:8 is used, the maximum absorption is somewhat red-shifted and an absorption shoulder around 600 nm appears. This implies that larger conjugation lengths exist in this polymer. When the molar feed ratio is increased, the red-shifted peaks disappeared.

Organic thin-film transistors were fabricated with an active semiconductor material based on the copolymer of 3-methyl thiophene and 3-hexyl thiophene with silicon dioxide used as the dielectric material. In order to improve the wettability of poly(alkyl thiophene) on silicon dioxide, the silicon dioxide surface first was treated with octadecyl trichlorosilane (OTS). Organic thin-film transistors fabricated from the copolymer of 3-methyl thiophene and 3-hexyl thiophene as active semiconductor material with the use of a so-called semi-seal dip-coating method and OTS-treated silicon dioxide as gate isolator, showed good characteristics with a field-effect mobility of 0.05–0.02 cm$^2$ V·s. The copolymers used had a higher field effect than poly(3-hexyl thiophene). In particular thin-film transistors using a copolymer formed with a molar feed ratio of 2:8 had better transistor characteristics than thin-film transistors with copolymers formed with a different molar feed ratio.

What is claimed is:

1. A thin-film transistor comprising a layer of semiconducting organic material provided on an insulating substrate and integrated with at least two electrical contacts for applying an electric voltage to said semiconducting organic material, characterized in that the semiconducting organic material is a semiconducting organic random copolymer with a highly ordered chain structure, a large effective conjugation length and a high regioregularity, and that the copolymer is synthesized from different fractions of at least two organic monomer compounds, wherein the smallest of the at least two monomer compounds is present in the lowest fraction.

2. A transistor according to claim 1, characterized in that said semiconducting organic copolymer is a copolymer of thiophenes.

3. A transistor according to claim 2, characterized in that said thiophenes copolymer comprises monomers of thiophene and/or alkyl-substituted thiophene compounds.

4. A transistor according to claim 1, characterized in that said copolymer is a copolymer of one or more of the following monomer compounds: is substituted and/or unsubstituted phenylenes, xylylenes, xylylidenes, phenylene sulfides, or classes of these monomer compounds.

5. A transistor according to claim 1, characterized in that said copolymer is a copolymer of general semiconducting and/or conducting organic polymers synthesized from monomer compounds.

6. A transistor according to claim 5, characterized in that said organic polymers are synthesized from one of the following compounds: N-vinylcarbazole, epoxyproprycarbazole, pyromellitimide, N-phenylbenzimidazole, benzoxazole, acylonitrile, azine, phtalocyanine, vinylene, azophenylene, phenylenequinone, or phenyleneferrocene.

7. A transistor according to claim 2, characterized in that said copolymer is a copolymer of thiophene and one or more alkyl-substituted thiophene monomers.

8. A transistor according to claim 2, characterized in that said copolymer is a copolymer of thiophene and one of the following thiophene compounds: 3-hexylthiophene, 3-butylthiophene, or dodecylthiophene.

9. A transistor according to claim 2, characterized in that said copolymer is a copolymer of 3-methylthiophene and one of the following thiophene compounds: 3-hexylthiophene, 3-butylthiophene, or dodecylthiophene.

10. A method of producing an organic thin-film transistor of claim 1 which comprises providing on an insulating substrate, a layer of a semi-conducting organic material that contains a semiconducting organic copolymer with a highly ordered chain structure and increased conjugation length formed from at least two organic monomer compounds.

11. A method of producing an organic thin-film transistor of claim 1 which comprises providing on an insulating substrate, a layer of a semi-conducting organic material that contains a copolymer of 3-methyl thiophene as an active semiconducting material.

* * * * *